United States Patent
Takayama et al.

(10) Patent No.: US 12,338,546 B2
(45) Date of Patent: Jun. 24, 2025

(54) GALLIUM ARSENIDE SINGLE CRYSTAL AND GALLIUM ARSENIDE SINGLE CRYSTAL SUBSTRATE

(71) Applicant: SUMITOMO ELECTRIC INDUSTRIES, LTD., Osaka (JP)

(72) Inventors: Hidetoshi Takayama, Kobe (JP); Yukio Ishikawa, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 1359 days.

(21) Appl. No.: 16/963,682

(22) PCT Filed: Aug. 7, 2018

(86) PCT No.: PCT/JP2018/029679
§ 371 (c)(1),
(2) Date: Jul. 21, 2020

(87) PCT Pub. No.: WO2020/031273
PCT Pub. Date: Feb. 13, 2020

(65) Prior Publication Data
US 2021/0079556 A1  Mar. 18, 2021

(51) Int. Cl.
  C30B 11/00 (2006.01)
  C30B 29/42 (2006.01)
(52) U.S. Cl.
  CPC ............ C30B 29/42 (2013.01); C30B 11/003 (2013.01)
(58) Field of Classification Search
  CPC ......... C30B 11/00; C30B 11/04; C30B 29/42; H01L 29/20; H01L 29/34; H01L 29/36
  See application file for complete search history.

(56) References Cited

U.S. PATENT DOCUMENTS

| 5,725,658 A | 3/1998 | Sawada |
| 5,985,678 A | 11/1999 | Kiyama |

(Continued)

FOREIGN PATENT DOCUMENTS

| EP | 0 709 498 A1 | 5/1996 |
| EP | 0 798 773 A2 | 10/1997 |

(Continued)

OTHER PUBLICATIONS

Nov. 13, 2018 Written Opinion issued in International Patent Application No. PCT/JP2018/029679.

(Continued)

*Primary Examiner* — Kevin Ct Li
(74) *Attorney, Agent, or Firm* — Oliff PLC

(57) ABSTRACT

A gallium arsenide single crystal including a straight body portion having a cylindrical shape, wherein a residual strain in a tangential direction in an outer circumferential portion is a compressive strain, the outer circumferential portion extending between an inner circumferential surface located 10 mm inward from an outer circumferential surface of the straight body portion toward a central axis and a location located 5 mm inward from the outer circumferential surface. There is a gallium arsenide single crystal substrate, wherein a residual strain in a tangential direction in an outer circumferential portion is a compressive strain, the outer circumferential portion extending between an inner circumference located 10 mm inward from an outer circumference toward a center and a location located 5 mm inward from the outer circumference.

9 Claims, 6 Drawing Sheets

(56) References Cited

U.S. PATENT DOCUMENTS

| | | | | |
|---|---|---|---|---|
| 6,045,767 | A * | 4/2000 | Liu | C30B 29/42 |
| | | | | 117/81 |
| 6,127,288 | A | 10/2000 | Kiyama | |
| 6,180,269 | B1 * | 1/2001 | Hagi | H01L 21/02463 |
| | | | | 428/689 |
| 6,184,498 | B1 * | 2/2001 | Kiyama | H01L 22/20 |
| | | | | 118/724 |
| 6,235,543 | B1 | 5/2001 | Kiyama | |
| 7,473,317 | B2 * | 1/2009 | Hagi | C30B 29/42 |
| | | | | 117/200 |
| 2012/0288403 | A1 | 11/2012 | Kimura | |
| 2012/0292747 | A1 * | 11/2012 | Miyahara | H01L 21/02052 |
| | | | | 257/632 |

FOREIGN PATENT DOCUMENTS

| | | | |
|---|---|---|---|
| JP | 59182298 A * | 10/1984 | C30B 27/02 |
| JP | S59-182298 A | 10/1984 | |
| JP | H08-119800 A | 5/1996 | |
| JP | H09-321105 A | 12/1997 | |
| JP | H11-268997 A | 10/1999 | |
| JP | 2004-203687 A | 7/2004 | |
| JP | 2007-103877 A | 4/2007 | |
| JP | 2012-236750 A | 12/2012 | |

OTHER PUBLICATIONS

Masayoshi Yamada, "Quantitative photoelastic measurement of residual strains in undoped semi-insulating gallium arsenide" Appl. Phys. Lett. vol. 47, No. 4, Aug. 15, 1985, pp. 365-367.

Nov. 13, 2018 International Search Report issued in International Patent Application No. PCT/JP2018/029679.

Geiler, H.D. et al., "Photoelastic characterization of residual stress in GaAs-wafers," Materials Science in Semiconductor Processing, 2006, vol. 9, pp. 345-350.

* cited by examiner

GALLIUM ARSENIDE SINGLE CRYSTAL AND GALLIUM ARSENIDE SINGLE CRYSTAL SUBSTRATE

TECHNICAL FIELD

The present disclosure relates to a gallium arsenide single crystal and a gallium arsenide single crystal substrate.

BACKGROUND ART

A GaAs (gallium arsenide) single crystal having a small residual strain has been proposed as a substrate of a light emitting device and an electronic device, in order to grow a semiconductor layer of high crystal quality on the GaAs single crystal.

Japanese Patent Laying-Open No. 11-268997 (PTL 1) discloses that in heat treatment of a GaAs crystal obtained by a vertical Bridgman method, a temperature change in a temperature elevating or cooling process is not more than 300° C./hour in a temperature range of not more than 600° C., not more than 150° C./hour in a temperature range of 600° C. to 750° C., and not more than 50° C./hour in a temperature range of 750° C. to a heat treatment temperature, and a temperature is kept in a temperature range of 800° C. to 1000° C. for 1 to 100 hours, to thereby obtain a GaAs crystal in which an average of the magnitude of a residual strain obtained by photoelastic measurement is less than $1 \times 10^{-5}$.

Japanese Patent Laying-Open No. 2012-236750 (PTL 2) discloses that at a solid-liquid interface between a solid phase that forms a GaAs single crystal and a liquid phase composed of a GaAs melt during manufacturing of the GaAs single crystal by an LEC (Liquid Encapsulated Czochralski) method, the solid phase is shaped to be convex on a liquid phase side, and a degree of convexity (ratio T1/T2 between a length T1 from an interface between the GaAs melt and a liquid sealant to a tip of the convex shape and an outer diameter T2 of the GaAs single crystal) of the convex shape is set to be not less than 0.25, and a crystal growth rate V1 in a relative movement direction at the solid-liquid interface is set to be 4 mm/hour to 7 mm/hour and a cooling rate V2 of the solid phase is set to be not more than 5° C./hour, to thereby obtain a GaAs single crystal wafer including a region in which an absolute value of a residual strain in a wafer plane is less than $1.0 \times 10^{-5}$ in a central portion of the above-described plane and not less than $1.0 \times 10^{-5}$ in an outer circumferential portion of the above-described plane and a region in which the absolute value of the residual strain in the wafer plane is less than $1.0 \times 10^{-5}$ in a [011] direction of the above-described outer circumferential portion.

CITATION LIST

Patent Literature

PTL 1: Japanese Patent Laying-Open No. 11-268997
PTL 2: Japanese Patent Laying-Open No. 2012-236750

SUMMARY OF INVENTION

A gallium arsenide single crystal according to an embodiment of the present disclosure includes a straight body portion having a cylindrical shape, wherein a residual strain in a tangential direction in an outer circumferential portion is a compressive strain, the outer circumferential portion extending between an inner circumferential surface located 10 mm inward from an outer circumferential surface of the straight body portion toward a central axis and a location located 5 mm inward from the outer circumferential surface.

In a gallium arsenide single crystal substrate according to another embodiment of the present disclosure, a residual strain in a tangential direction in an outer circumferential portion is a compressive strain, the outer circumferential portion extending between an inner circumference located 10 mm inward from an outer circumference toward a center and a location located 5 mm inward from the outer circumference.

DETAILED DESCRIPTION

Figure 1:
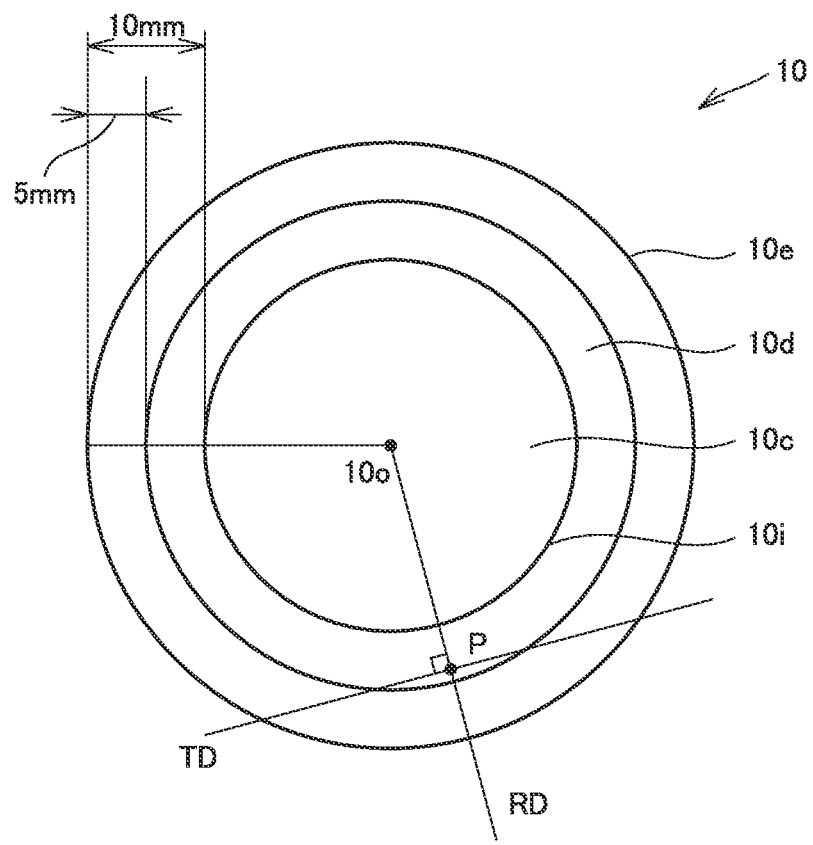
FIG. 1 is a schematic plan view showing a gallium arsenide single crystal according to an embodiment of the present disclosure.

Problem to be Solved by the Present Disclosure

The GaAs crystal disclosed in Japanese Patent Laying-Open No. 11-268997 (PTL 1) or the GaAs single crystal wafer disclosed in Japanese Patent Laying-Open No. 2012-236750 (PTL 2) has such a problem that slip occurs in the GaAs crystal or the GaAs single crystal wafer when a rate of temperature elevation to a growth temperature when growing a semiconductor layer on the GaAs crystal or the GaAs single crystal wafer is high. The slip herein is seen when dislocation moves in a limited manner in an easy sliding system. When the slip occurs in a single crystal wafer having a mirror-polished surface, the slip is observed as a level difference on a surface of the GaAs single crystal wafer using a differential interference microscope. When the slip is significant, the slip is observed even visually. In the slip portion, dislocation is present at high density, which leads to a failure of a device or the like in a subsequent step. Therefore, prevention of the occurrence of the slip is necessary. It is conceivable that the slip occurs due to a thermal stress during growth of the GaAs crystal or a stress in use of the GaAs single crystal wafer.

Accordingly, it is an object to solve the above-described problem and provide a gallium arsenide single crystal and a gallium arsenide single crystal substrate in which the occurrence of slip is suppressed when a semiconductor layer is grown on the gallium arsenide single crystal and the gallium arsenide single crystal substrate.

Advantageous Effect of the Present Disclosure

According to the present disclosure, there can be provided a gallium arsenide single crystal and a gallium arsenide single crystal substrate in which the occurrence of slip is suppressed when a semiconductor layer is grown on the gallium arsenide single crystal and the gallium arsenide single crystal substrate.

DESCRIPTION OF EMBODIMENTS

First, embodiments of the present disclosure are listed below.

[1] A gallium arsenide single crystal according to an embodiment of the present disclosure includes a straight body portion having a cylindrical shape, wherein a residual strain in a tangential direction in an outer circumferential portion is a compressive strain, the outer circumferential portion extending between an inner circumferential surface located 10 mm inward from an outer circumferential surface of the straight body portion toward a central axis and a location located 5 mm inward from the outer circumferential surface. In the gallium arsenide single crystal according to the present embodiment, the occurrence of slip is suppressed when a semiconductor layer is grown on the gallium arsenide single crystal.

[2] In the gallium arsenide single crystal described above, an average value of the magnitude of the residual strain in the outer circumferential portion can be not less than $2.5 \times 10^{-6}$ and not more than $1.5 \times 10^{-5}$, the magnitude of the residual strain being represented by an absolute value $|Sr-St|$ of a difference between a radial strain component Sr and a tangential strain component St. In the gallium arsenide single crystal, the occurrence of slip is further suppressed when a semiconductor layer is grown on the gallium arsenide single crystal.

[3] In the gallium arsenide single crystal described above, the straight body portion can have a diameter of not less than 100 mm and not more than 305 mm. Even in the gallium arsenide single crystal, the occurrence of slip is suppressed when a semiconductor layer is grown on the gallium arsenide single crystal.

[4] In a gallium arsenide single crystal substrate according to another embodiment of the present disclosure, a residual strain in a tangential direction in an outer circumferential portion is a compressive strain, the outer circumferential portion extending between an inner circumference located 10 mm inward from an outer circumference toward a center and a location located 5 mm inward from the outer circumference. In the gallium arsenide single crystal substrate according to the present embodiment, the occurrence of slip is suppressed when a semiconductor layer is grown on the gallium arsenide single crystal substrate.

[5] In the gallium arsenide single crystal substrate described above, an average value of the magnitude of the residual strain in the outer circumferential portion can be not less than $2.5 \times 10^{-6}$ and not more than $1.5 \times 10^{-5}$, the magnitude of the residual strain being represented by an absolute value $|Sr-St|$ of a difference between a radial strain component Sr and a tangential strain component St. In the gallium arsenide single crystal substrate, the occurrence of slip is further suppressed when a semiconductor layer is grown on the gallium arsenide single crystal substrate.

[6] In the gallium arsenide single crystal substrate described above, a diameter can be not less than 100 mm and not more than 305 mm. Even in the gallium arsenide single crystal substrate, the occurrence of slip is suppressed when a semiconductor layer is grown on the gallium arsenide single crystal substrate.

Details of Embodiments of the Present Disclosure

First Embodiment: Gallium Arsenide Single Crystal (Gallium Arsenide Single Crystal)
Referring to FIG. 1, a GaAs single crystal 10 (gallium arsenide single crystal) according to the present embodiment includes a straight body portion having a cylindrical shape, in which a residual strain in a tangential direction TD in an outer circumferential portion 10d is a compressive strain, outer circumferential portion 10d extending between an inner circumferential surface 10i located 10 mm inward from an outer circumferential surface 10e of the straight body portion toward a central axis 10o and a location located 5 mm inward from outer circumferential surface 10e. The residual strain in outer circumferential portion 10d of GaAs single crystal 10 herein refers to a residual strain at a point P that is arbitrarily specified in outer circumferential portion 10d of GaAs single crystal 10. A direction of the residual strain is divided into a radial direction RD and tangential direction TD. Radial direction RD refers to a radial direction that connects central axis 10o and arbitrarily specified point P. Tangential direction TD refers to a direction perpendicular to the radial direction at point P and is also called "circumferential direction". The residual strain includes a compressive strain and a tensile strain.

If a temperature elevating rate is high when a semiconductor layer is grown on the GaAs single crystal, tensile deformation occurs in the tangential direction in the outer circumferential portion of the GaAs single crystal. Therefore, when the residual strain in a tensile direction in the tangential direction is present in the outer circumferential portion of the GaAs single crystal, slip is likely to occur in the GaAs single crystal because deformation caused by heat when the semiconductor layer is grown is added. In GaAs single crystal 10 according to the present embodiment, the residual strain in tangential direction TD in outer circumferential portion 10d is a compressive strain. Therefore, when the semiconductor layer is grown on GaAs single crystal 10, the occurrence of slip in GaAs single crystal 10 is suppressed because the compressive strain, which is a strain in a direction of relaxing a tensile stress caused by heat applied to GaAs single crystal 10, is present.

The residual strain of GaAs single crystal 10 is represented by an absolute value $|Sr-St|$ of a difference between a radial strain component Sr and a tangential strain component St, and the magnitude (absolute value) of the residual strain and in-plane distribution of the magnitude are evaluated in a mirror-finished surface perpendicular to the central axis, using a photoelastic method. The photoelastic method alone cannot specify the type (compressive or tensile) of each of radial strain component Sr and tangential strain component St of the residual strain. The type (compressive or tensile) of each of radial strain component Sr and tangential strain component St of the residual strain can be evaluated in the mirror-finished surface of the GaAs single crystal perpendicular to the central axis, for example, by a Raman shift of a Raman scattering spectrum.

An average value of the magnitude of the residual strain in outer circumferential portion 10d of GaAs single crystal 10 is preferably not less than $2.5 \times 10^{-6}$ and not more than $1.5 \times 10^{-5}$. The magnitude of the residual strain in outer circumferential portion 10d of GaAs single crystal 10 refers to an absolute value of a residual strain at a point that is arbitrarily specified in outer circumferential portion 10d of GaAs single crystal 10. The average value of the magnitude of the residual strain refers to an average value of the magnitude of the residual strain at a plurality of points that are arbitrarily specified in outer circumferential portion 10d of GaAs single crystal 10. The average value of the magnitude of the residual strain is calculated from the above-described in-plane distribution evaluated using the above-described photoelastic method. In order to suppress slip of GaAs single crystal 10 when the semiconductor layer is grown, the above-described average value of the magnitude of the residual strain is preferably not less than $2.5 \times 10^{-6}$, and more preferably not less than $4.0 \times 10^{-6}$. In a cooling step after the semiconductor layer is grown on the GaAs single crystal, compressive deformation occurs in the tangential direction in the outer circumferential portion, contrary to the temperature elevating step. When the compressive residual strain in the tangential direction in the outer circumferential portion of the GaAs single crystal is too large, the above-described residual strain is preferably not more than $1.5 \times 10^{-5}$ in order to reduce the risk of occurrence of slip during the cooling step.

A diameter of the straight body portion of GaAs single crystal 10 is preferably not less than 100 mm and not more than 305 mm. That is, in order to enhance the effect of suppressing slip in GaAs single crystal 10, the above-described diameter is preferably not less than 100 mm, and more preferably not less than 150 mm. In addition, in order to maintain the effect of suppressing slip in GaAs single crystal 10, the above-described diameter is preferably not more than 305 mm, and more preferably not more than 204 mm. Under the same temperature gradient condition, deformation caused by a thermal stress becomes greater as the diameter becomes larger. Therefore, under a condition for growing the GaAs single crystal from a melt, the residual strain in the tangential direction in the outer circumferential portion, that is suitable for maintaining the slip suppressing effect, can be provided by selecting the appropriate diameter.

(Manufacturing Apparatus for Gallium Arsenide Single Crystal)

Figure 2:
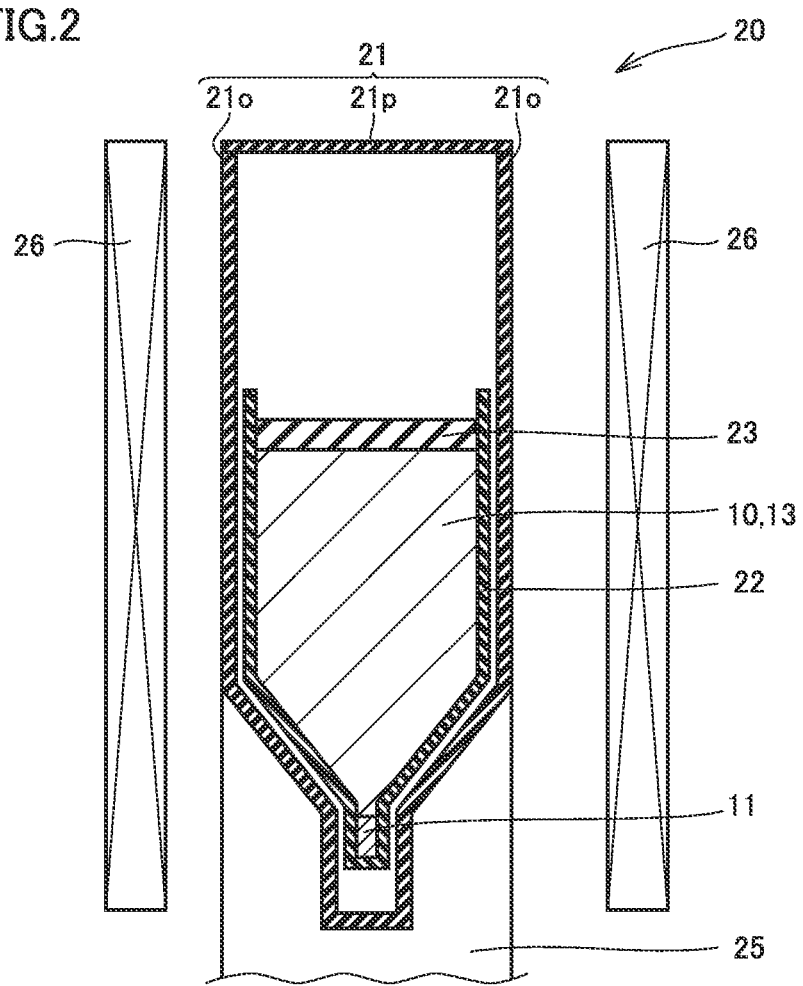
FIG. 2 is a schematic cross-sectional view showing a manufacturing apparatus and a manufacturing method for a typical gallium arsenide single crystal.
Figure 3:
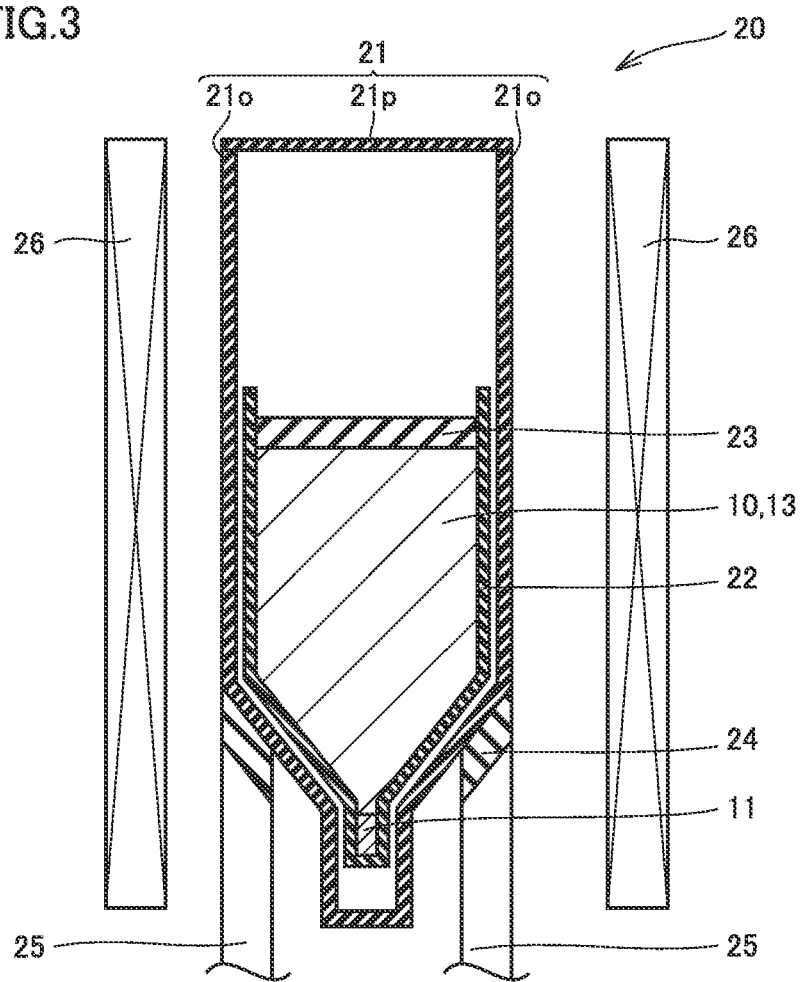
FIG. 3 is a schematic cross-sectional view showing a manufacturing apparatus and a manufacturing method for the gallium arsenide single crystal according to the embodiment of the present disclosure.

FIG. 2 shows a manufacturing apparatus and a manufacturing method for a typical GaAs (gallium arsenide) single crystal. FIG. 3 shows a manufacturing apparatus and a manufacturing method for the GaAs (gallium arsenide) single crystal according to the present embodiment.

Referring to FIG. 2, in order to efficiently manufacture a high-quality GaAs single crystal, a manufacturing apparatus 20 for a typical GaAs single crystal preferably includes a container 21 that accommodates a crucible 22. Specifically, above-described manufacturing apparatus 20 for the GaAs single crystal preferably includes container 21, crucible 22 arranged inside container 21, a holding table 25 that holds container 21, and a heater 26 arranged around the outside of container 21.

Container 21 has a shape corresponding to crucible 22 described below, and includes a seed crystal corresponding portion and a crystal growth corresponding portion that correspond to a seed crystal holding portion and a crystal growth portion of crucible 22, respectively. The seed crystal corresponding portion is a hollow cylindrical portion that is open to a side connected to the crystal growth corresponding portion and has a bottom wall on an opposite side. The crystal growth corresponding portion includes a conical portion connected to the seed crystal corresponding portion on an axial small-diameter side, and a hollow cylindrical straight body portion connected to an axial large-diameter side of the conical portion. A material of container 21 is not particularly limited as long as it is a material that can withstand a temperature during melting of a source material and has a high mechanical strength. However, in order to obtain a high-purity material at low cost, quartz or the like is preferable.

Crucible 22 includes the seed crystal holding portion, and the crystal growth portion connected onto the seed crystal holding portion. The seed crystal holding portion is a hollow cylindrical portion that is open to a side connected to the crystal growth portion and has a bottom wall on an opposite side, and a GaAs seed crystal 11 can be held in this portion. The crystal growth portion includes a conical portion connected to the seed crystal holding portion on an axial small-diameter side, and a hollow cylindrical straight body portion connected to an axial large-diameter side of the conical portion. The crystal growth portion has the function of holding therein a GaAs source material 13 and a sealing member 23 arranged thereon, and growing GaAs single crystal 10 by solidifying GaAs source material 13 heated to a molten state. A material of crucible 22 is not particularly limited as long as it is a material that can withstand a temperature during melting of the source material and has a high mechanical strength. However, PBN (pyrolytic boron nitride) or the like is preferable because PBN is high in purity and low in reactivity to the source material and the sealing member.

A material of sealing member 23 is not particularly limited as long as it is a material that can withstand a temperature during melting of the source material and has the function of suppressing a composition deviation caused by decomposition of As. Boron oxides such as $B_2O_3$ is preferable.

Holding table 25 is not particularly limited as long as it can hold container 21 and move container 21 relative to heater 26 as necessary to appropriately control growth of GaAs single crystal 10 resulting from melting and solidification of GaAs source material 13. However, in order to suppress a temperature gradient in the GaAs single crystal, a central portion preferably has a cavity. Heater 26 is not particularly limited as long as it can appropriately control growth of GaAs single crystal 10 resulting from melting and solidification of GaAs source material 13.

Referring to FIG. 3, the manufacturing apparatus for the GaAs (gallium arsenide) single crystal according to the present embodiment further includes a heat retention member 24 arranged between holding table 25 and at least the conical portion of the crystal growth corresponding portion of container 21, in addition to container 21, crucible 22 arranged inside container 21, holding table 25 that holds container 21, and heater 26 arranged around the outside of container 21. By arranging heat retention member 24, a temperature gradient in the GaAs single crystal that occurs in the cooling step after crystal growth is suppressed, and thus, it is possible to obtain GaAs single crystal 10 including the straight body portion having the cylindrical shape, in which the residual strain in the tangential direction in the outer circumferential portion is a compressive strain, the outer circumferential portion extending between the inner circumferential surface located 10 mm inward from the outer circumferential surface of the straight body portion toward the central axis and the location located 5 mm inward from the outer circumferential surface. In order to suppress the temperature gradient in the GaAs single crystal, heat retention member 24 is preferably arranged on the outer circumferential side of the conical portion of container 21 that is in contact with holding table 25. A material of heat retention member 24 is not particularly limited as long as it is a material that can withstand a high temperature during crystal growth and does not react with a member that comes into contact with heat retention member 24. However, a high-purity alumina fiber-based heat insulating sheet is preferable because of high heat resistance and low cost.

(Manufacturing Method for Gallium Arsenide Single Crystal)

Referring to FIGS. 2 and 3, the manufacturing methods for the typical GaAs single crystal and GaAs single crystal 10 according to the present embodiment are preferably a boat method such as a VB (vertical boat) method using above-described manufacturing apparatus 20, in order to obtain GaAs single crystal 10 having high crystal quality and including the long straight body portion that will form a GaAs single crystal substrate, which is a product. Specifically, the manufacturing method for GaAs single crystal 10 according to the present embodiment preferably includes a GaAs seed crystal loading step, a GaAs source material loading step, a sealing member placing step, a crystal growing step, and a cooling step.

First, GaAs seed crystal 11 is loaded in the seed crystal holding portion of crucible 22 in the GaAs seed crystal loading step. Next, in the GaAs source material loading step, GaAs source material 13 is loaded in the crystal growth portion (the conical portion and the straight body portion) of crucible 22. Here, GaAs source material 13 is not particularly limited as long as it is GaAs having high purity. A GaAs polycrystal body or the like is used suitably therefor. Next, in the sealing member placing step, sealing member 23 is placed on GaAs source material 13 in crucible 22. Next, crucible 22 in which GaAs seed crystal 11, GaAs source material 13, and sealing member 23 are disposed in this order from below to above is arranged inside a container main body 21o, and container 21 is sealed with a container lid 21p to thereby obtain sealed container 21.

Next, in the crystal growing step, above-described container 21 that accommodates above-described crucible 22 is arranged in manufacturing apparatus 20. Container 21 is held by holding table 25 and heater 26 is arranged to surround container 21. Furthermore, in FIG. 3, heat retention member 24 is arranged between holding table 25 and the conical portion of the crystal growth corresponding portion of container 21. Next, GaAs source material 13 and sealing member 23 are heated with heater 26 to thereby melt GaAs source material 13 and sealing member 23. Next, by moving container 21 axially downward relative to heated heater 26 in the VB method, such a temperature gradient is formed that the temperature on the GaAs source material 13 side is relatively high and the temperature on the GaAs seed crystal 11 side is relatively low in the axial direction of crucible 22. As a result, molten GaAs source material 13 is sequentially solidified from the GaAs seed crystal 11 side, and thus, GaAs single crystal 10 grows.

Figure 4A:
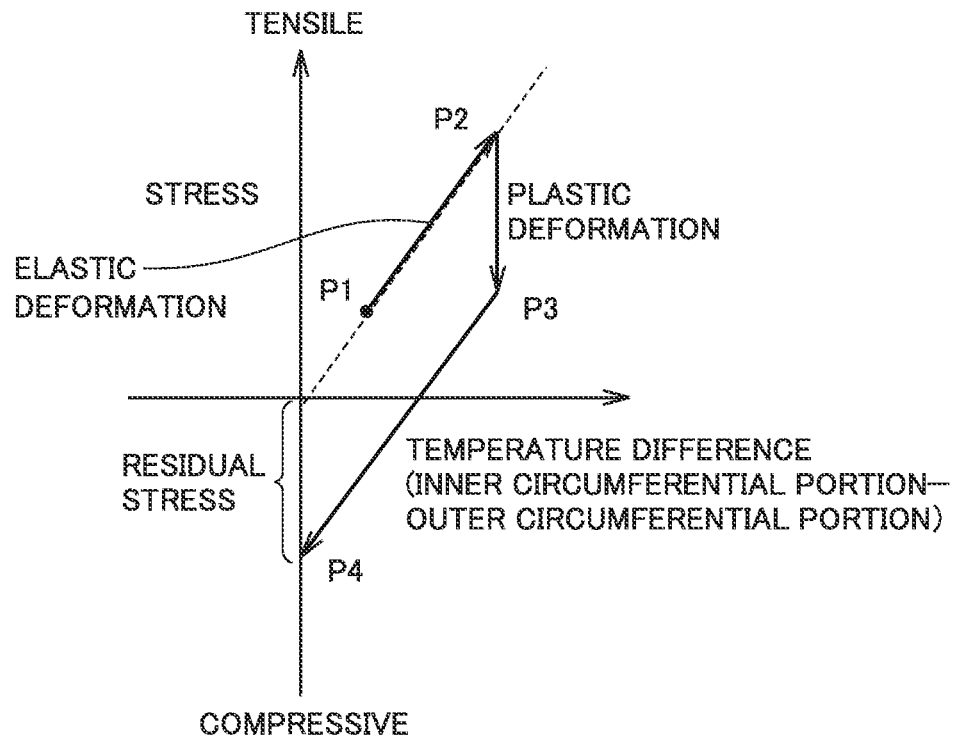
FIG. 4A is a graph showing an example of relationship between a temperature difference and a stress in the gallium arsenide single crystal when the gallium arsenide single crystal is cooled using a typical method.

At the end of growth, GaAs single crystal 10 has a low temperature on the GaAs seed crystal 11 side and a high temperature on the finally solidified portion side. When there is a temperature difference in a crystal longitudinal direction, a temperature difference also occurs in a crystal radial direction and a thermal stress proportional to the temperature difference occurs. Referring to FIG. 4A, at a point P1 at the end of growth, i.e., at the start of cooling, there is a temperature difference in GaAs single crystal 10, and thus, there is a thermal stress corresponding to the temperature difference. When cooling is performed in this state, the temperature difference increases generally. When a point P2 of a critical thermal stress is reached, stress relaxation occurs due to plastic deformation. When the temperature further decreases, a point P3 at which plastic deformation of GaAs single crystal 10 no longer occurs is reached. As a result of subsequent cooling, a point P4 at the time of room temperature is reached, and a residual stress and a residual strain corresponding to the residual stress are generated.

Figure 4B:
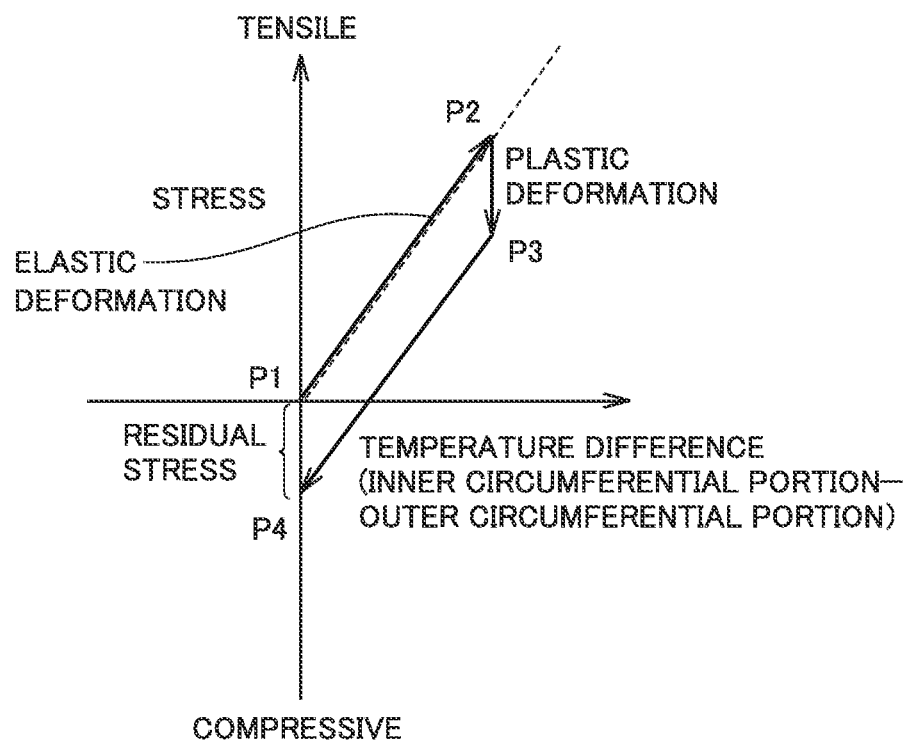
FIG. 4B is a graph showing another example of relationship between a temperature difference and a stress in the gallium arsenide single crystal when the gallium arsenide single crystal is cooled using a typical method, with a temperature difference in a longitudinal direction of the gallium arsenide single crystal reduced.

When the temperature of heater 26 is adjusted to be uniform to reduce the temperature difference between the GaAs seed crystal 11 side and the finally solidified portion side of GaAs single crystal 10, and then, the entire GaAs single crystal is cooled at a constant rate in the cooling step, a reduction in thermal stress caused by the temperature difference can be expected in an initial state of the start of cooling. Referring to FIG. 4B, by reducing the temperature difference at point P1 at the start of cooling, the temperature up to point P2 of the critical thermal stress can be reduced, and an amount of plastic deformation from point P2 to point P3 at which plastic deformation no longer occurs can be reduced, and the residual stress and the residual strain corresponding to the residual stress at point P4 at the time of room temperature after subsequent cooling can be reduced. A heat equalization temperature (a temperature of the heater controlled for heat equalization of the GaAs single crystal; the same applies to the description below) is not particularly limited as long as the temperature difference between the GaAs seed crystal 11 side and the finally solidified portion side of GaAs single crystal 10 is small. However, in order to shorten the time to arrival at the heat equalization temperature, the heat equalization temperature is preferably not less than 800° C. and not more than 1200° C., and more preferably not less than 850° C. and not more than 1150° C.

Figure 4C:
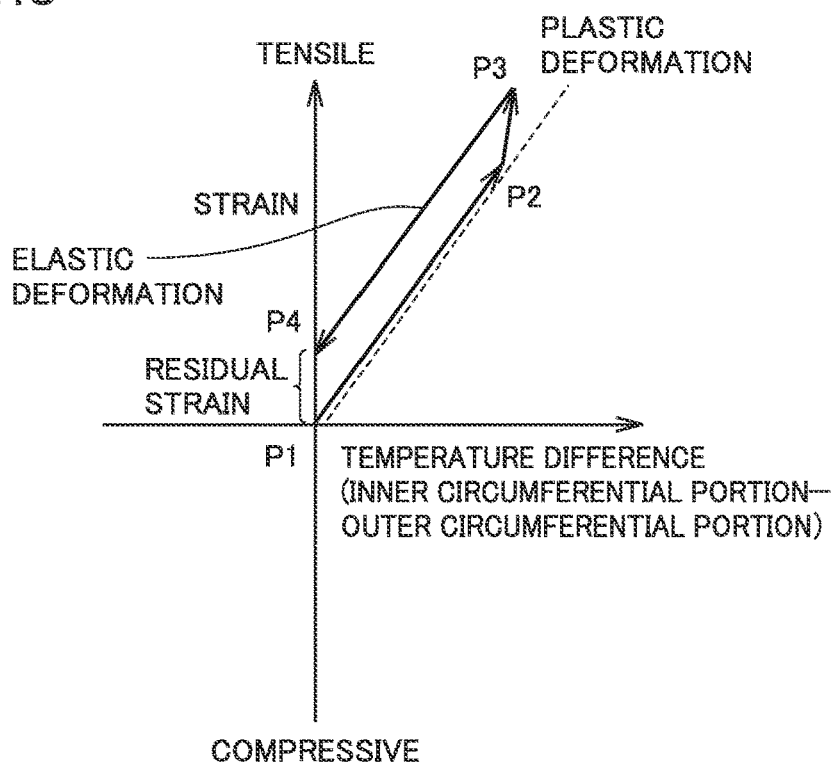
FIG. 4C is a graph showing an example of relationship between a temperature difference and a strain in the gallium arsenide single crystal when the gallium arsenide single crystal is cooled using a typical method, with a temperature difference in a longitudinal direction of the gallium arsenide single crystal reduced.

Referring to FIG. 2, even when the above-described heat equalization process is performed at the start of cooling of GaAs single crystal 10, heat transfer by radiation from the outer circumferential portion of GaAs single crystal 10 is dominant in a temperature zone around 1000° C., and thus, a temperature difference between the outer circumferential portion 10d side and the inner circumferential portion 10c side of GaAs single crystal 10 becomes larger as the temperature becomes lower. That is, such a temperature gradient is formed that the temperature of inner circumferential portion 10c (a portion extending from central axis 10o of the straight body portion to inner circumferential surface 10i (located 10 mm inward from outer circumferential surface 10e toward central axis 10o) of GaAs single crystal 10 shown in FIG. 1; the same applies to the description below) of GaAs single crystal 10 is high and the temperature of outer circumferential portion 10d (a portion extending between inner circumferential surface 10i located 10 mm inward from outer circumferential surface 10e of the straight body portion of GaAs single crystal 10 shown in FIG. 1 toward central axis 10o and the location located 5 mm inward from outer circumferential surface 10e; the same applies to the description below) of GaAs single crystal 10 is low. Referring to FIGS. 1 and 4B, when the temperature difference between inner circumferential portion 10c and outer circumferential portion 10d shown in FIG. 1 is sufficiently small, deformation of outer circumferential portion 10d occurs only inside an elastic deformation region between point P1 and point P2 in FIG. 4B, and the residual stress and the residual strain are not generated. In contrast, when the temperature difference between inner circumferential portion 10c and outer circumferential portion 10d shown in FIG. 1 becomes larger and plastic deformation occurs due to the stress of outer circumferential portion 10d as in from point P2 to point P3 in FIG. 4B, the stress and the strain remain even at point P4 at the time of room temperature after cooling. FIG. 4C is a graph in which the vertical axis represents strain instead of stress in FIG. 4B. In the elastic deformation region, the progression from point P1 at the start of cooling to point P2 of the critical thermal stress in FIG. 4C is seen. However, when a plastic strain occurs, the strain deviates to become greater than expected from an extension of point P1 and point P2 in FIG. 4C (refer to point P3 in FIG. 4C at which plastic deformation no longer occurs). When the temperature decreases, the strength of GaAs single crystal 10 increases and elastic deformation occurs again, the temperature difference and the strain progresses linearly from point P3 to point P4 at the time of room temperature. When outer circumferential portion 10d in FIG. 1 is cooled first, the residual strain in the tangential direction, which is the circumferential direction, is a tensile strain.

Figure 5:
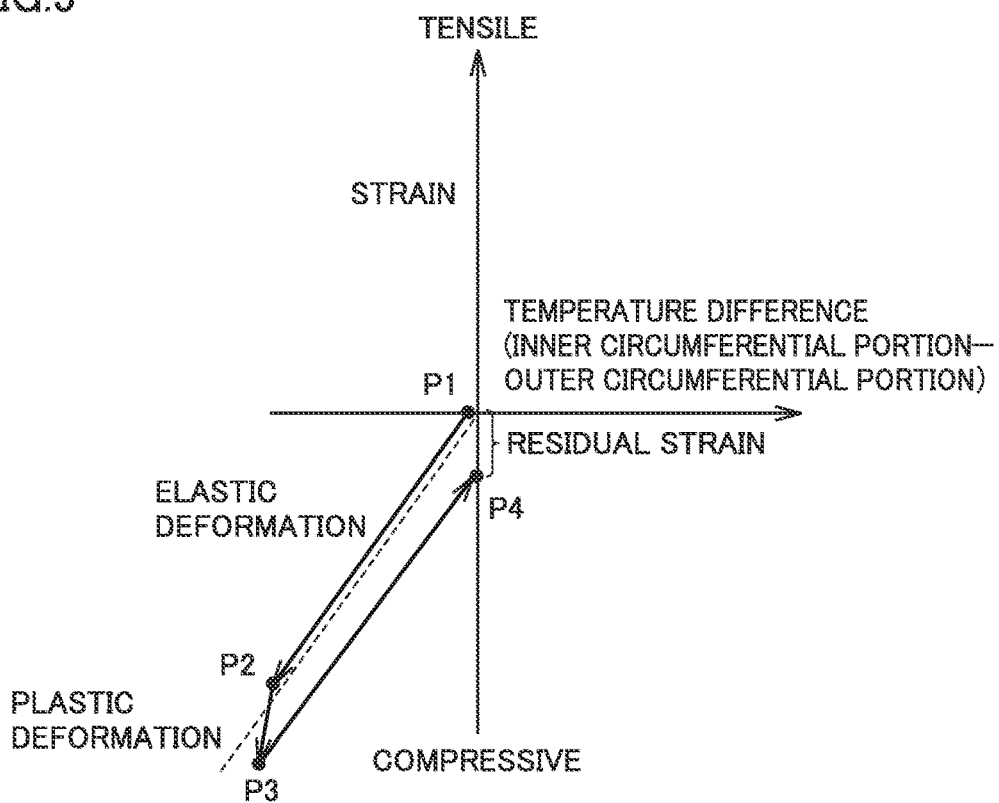
FIG. 5 is a graph showing an example of relationship between a temperature difference and a strain in the gallium arsenide single crystal when the gallium arsenide single crystal is cooled using a method according to an embodiment of the present disclosure.

Referring to FIG. 3, in the cooling step of GaAs single crystal 10 according to the present embodiment, the temperature in a length direction of the straight body portion is equalized after solidification of the finally solidified portion of the GaAs single crystal, thereby making the temperature gradient in the entire GaAs single crystal small. Preferably, the heat retention member is placed on the outer circumferential side of the conical portion of holding table 25, thereby moderating cooling of outer circumferential portion 10d of GaAs single crystal 10. In addition, preferably, holding table 25 is formed such that the central portion thereof has a cavity, thereby promoting heat removal in a downward direction in inner circumferential portion 10c of GaAs single crystal 10. As a result of the foregoing, the temperature difference in GaAs single crystal 10 (particularly between outer circumferential portion 10d and inner circumferential portion 10c) in the cooling step can be reduced and made substantially uniform, and further, such a temperature gradient can be formed that the temperature of outer circumferential portion 10d is low and the temperature of inner circumferential portion 10c is high. In this manner, referring to FIGS. 1 and 5, a compressive strain occurs in tangential direction TD in outer circumferential portion 10d, based on a thermal expansion difference between outer circumferential portion 10d and inner circumferential portion 10c of GaAs single crystal 10. Therefore, when point P4 at the time of room temperature (e.g., 25° C.) shown in FIG. 5 is reached, the compressive strain occurs in tangential direction TD in outer circumferential portion 10d as the residual strain. In order to efficiently manufacture GaAs single crystal 10 in which the residual strain in tangential direction TD in outer circumferential portion 10d is a compressive strain, the temperature difference in GaAs single crystal 10 (in the length direction of the straight body portion of GaAs single crystal 10 and in the plane perpendicular to the length direction) during heat equalization of GaAs single crystal 10 in the cooling step is preferably not more than 5° C., and more preferably not more than 2° C.

Second Embodiment: Gallium Arsenide Single Crystal Substrate (Gallium Arsenide Single Crystal Substrate)

Figure 6:
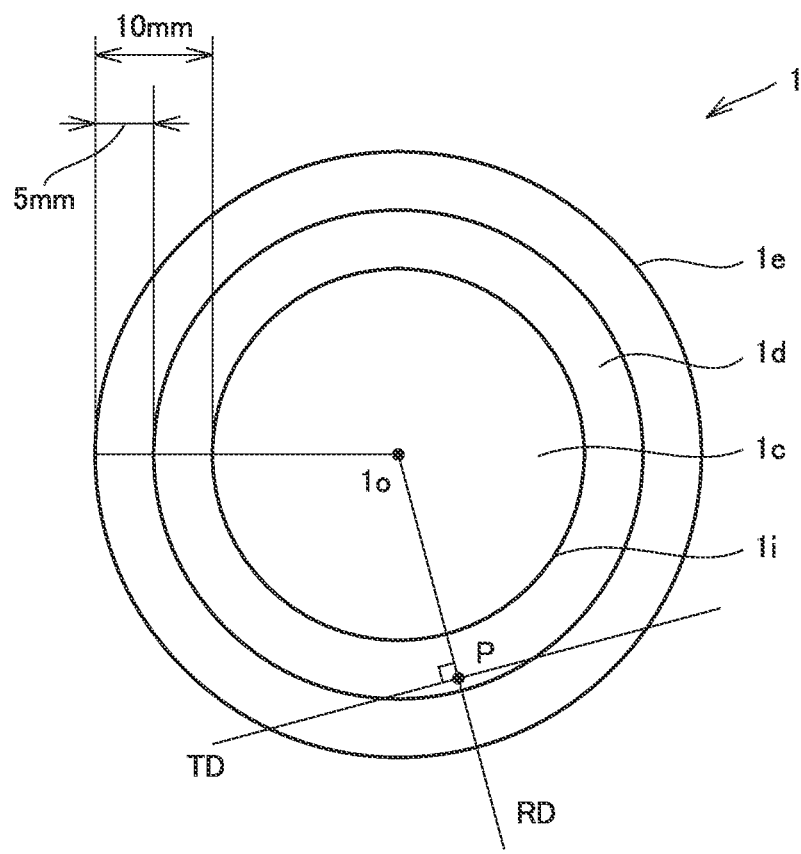
FIG. 6 is a schematic plan view showing a gallium arsenide single crystal substrate according to another embodiment of the present disclosure.

Referring to FIG. 6, in a GaAs single crystal substrate 1 (gallium arsenide single crystal substrate) according to the present embodiment, a residual strain in a tangential direction TD in an outer circumferential portion 1d is a compressive strain, outer circumferential portion 1d extending between an inner circumference 1i located 10 mm inward from an outer circumference 1e toward a center 1o and a location located 5 mm inward from outer circumference 1e. The residual strain in outer circumferential portion 1d of GaAs single crystal substrate 1 herein refers to a residual strain at a point P that is arbitrarily specified in outer circumferential portion 1d of GaAs single crystal substrate 1. A direction of the residual strain is divided into a radial direction RD and tangential direction TD. Radial direction RD refers to a radial direction that connects center 1o and arbitrarily specified point P. Tangential direction TD refers to a direction perpendicular to the radial direction at point P and is also called "circumferential direction". The residual strain includes a compressive strain and a tensile strain.

If a temperature elevating rate is high when a semiconductor layer is grown on the GaAs single crystal substrate, a tensile stress is applied in the tangential direction in the GaAs single crystal substrate. Therefore, when the residual strain in a tensile direction in the tangential direction is present in the outer circumferential portion of GaAs single crystal substrate 1, slip is likely to occur in the GaAs single crystal substrate because a tensile stress caused by heat when the semiconductor layer is grown is added. In GaAs single crystal substrate 1 according to the present embodiment, the residual strain in tangential direction TD in outer circumferential portion 1d is a compressive strain. Therefore, when the semiconductor layer is grown on GaAs single crystal substrate 1, the occurrence of slip in GaAs single crystal substrate 1 is suppressed because the compressive strain, which is a strain in a direction of relaxing the tensile stress caused by heat applied to GaAs single crystal substrate 1, is present.

The residual strain of GaAs single crystal substrate 1 is represented by an absolute value |Sr−St| of a difference between a radial strain component Sr and a tangential strain component St, and the magnitude (absolute value) of the residual strain and in-plane distribution of the magnitude are evaluated in a mirror-finished surface perpendicular to the central axis, using a photoelastic method. The photoelastic method alone cannot specify the type (compressive or tensile) of each of radial strain component Sr and tangential strain component St of the residual strain. The type (compressive or tensile) of each of radial strain component Sr and tangential strain component St of the residual strain can be evaluated in the mirror-finished surface of the GaAs single crystal perpendicular to the central axis, for example, by a Raman shift of a Raman scattering spectrum.

An average value of the magnitude of the residual strain in outer circumferential portion 1d of GaAs single crystal substrate 1 is preferably not less than $2.5 \times 10^{-6}$ and not more than $1.5 \times 10^{-5}$. The magnitude of the residual strain in outer circumferential portion 1d of GaAs single crystal substrate 1 refers to an absolute value of a residual strain at a point that is arbitrarily specified in outer circumferential portion 1d of GaAs single crystal substrate 1. The average value of the magnitude of the residual strain refers to an average value of the magnitude of the residual strain (absolute value of a difference between radial strain component Sr and tangential strain component St) at a plurality of points that are arbitrarily specified in outer circumferential portion 1$d$ of GaAs single crystal substrate 1. The average value of the magnitude of the residual strain is calculated from the above-described in-plane distribution evaluated using the above-described photoelastic method. In order to suppress slip of GaAs single crystal substrate 1 when the semiconductor layer is grown, the above-described average value of the magnitude of the residual strain is preferably not less than $2.5 \times 10^{-6}$, and more preferably not less than $4.0 \times 10^{-6}$. In a cooling step after the semiconductor layer is grown on GaAs single crystal substrate 1, compressive deformation occurs in the tangential direction in the outer circumferential portion, contrary to the temperature elevating step. When the residual strain in the outer circumferential portion of the GaAs single crystal substrate is too large, the above-described residual strain is preferably not more than $1.5 \times 10^{-5}$ in order to reduce the risk of occurrence of slip during the cooling step.

A diameter of GaAs single crystal substrate 1 is preferably not less than 100 mm and not more than 305 mm. That is, in order to enhance the effect of suppressing slip in GaAs single crystal substrate 1, the above-described diameter is preferably not less than 100 mm, and more preferably not less than 150 mm. In addition, in order to maintain the effect of suppressing slip in GaAs single crystal substrate 1, the above-described diameter is preferably not more than 305 mm, and more preferably not more than 204 mm. Under the same temperature gradient condition, a thermal stress is proportional to the diameter. Therefore, under a condition for growing the GaAs single crystal substrate from a melt, the residual strain in the tangential direction in the outer circumferential portion, that is suitable for maintaining the slip suppressing effect, can be provided by selecting the appropriate diameter.

(Manufacturing Method for GaAs Single Crystal Substrate)

A manufacturing method for GaAs single crystal substrate 1 is not particularly limited, and suitable examples thereof include a method for cutting GaAs single crystal 10 according to the first embodiment in a plane perpendicular to central axis 10$o$ and mirror-finishing a main surface.

EXAMPLES

Comparative Example 1

1. Production of GaAs Single Crystal

Using the manufacturing apparatus shown in FIG. 2, a C (carbon)-doped semi-insulating GaAs single crystal including a straight body portion having a diameter of 156 mm and a length of 200 mm is produced in accordance with the VB method. A GaAs polycrystal is used as the GaAs source material. $B_2O_3$ is used as the sealing member. A temperature distribution in the manufacturing apparatus is adjusted such that a temperature gradient in a crystal growth direction at a crystal growth interface is 2° C./cm, and the GaAs single crystal is grown. Next, the grown GaAs single crystal is cooled to the room temperature (25° C.) at 25° C./min. A temperature difference in the GaAs single crystal at this time is 20±0.2° C. in the entire straight body portion of the GaAs single crystal. An outer circumferential surface of the cooled GaAs single crystal is ground, to thereby produce the GaAs single crystal including the straight body portion having a diameter of 152.4 mm.

2. Production of GaAs Single Crystal Substrate

The GaAs single crystal obtained above is sliced along a plane of the straight body portion perpendicular to a central axis, and front and rear main surfaces are both mirror-finished by mechanical polishing and chemical mechanical polishing (CMP), to thereby produce two (one from the seed crystal side and one from the finally solidified portion side) GaAs single crystal substrates each having a diameter of 152.4 mm and a thickness of 700 μm. There is no affected layer on both of the polished front and rear main surfaces. Various types of cleaning that can maintain the mirror surfaces after polishing may be performed. For each of the GaAs single crystal substrates obtained as described above, a type (compressive or tensile) of a residual strain in a tangential direction in an outer circumferential portion is evaluated from a Raman shift by measuring a Raman spectrum using a Raman spectrophotometer (HR evolution manufactured by HORIBA, Ltd.). Determination of an orientation of the residual strain in the tangential direction does not specify the magnitude, and thus, a measurement method other than the Raman shift may be used as long as it can determine the orientation. Evaluation of an average value of the magnitude of the residual strain in the outer circumferential portion represented by an absolute value |Sr−St| of a difference between a radial strain component Sr and a tangential strain component St can be performed based on, for example, the photoelastic method described in Appl. Phys. Lett. 47 (1985) pp. 365-367. Specifically, a light irradiation diameter on each substrate main surface is ϕ100 μm. The above-described average value of the magnitude of the residual strain in the outer circumferential portion is calculated by scanning and measuring the entire main surface at 0.5 mm-pitch square lattice points such that the center of the substrate main surface is included in the measurement points, and averaging all of the measurement values included in the outer circumferential portion extending between an inner circumference located 10 mm inward from an outer circumference toward a center and a location located 5 mm inward from the outer circumference. The crystallinity is evaluated by an average EPD (etch pit density) in the entire location located 5 mm inward from the outer circumferential surface. Specifically, molten potassium hydroxide is used as an etchant. The EPD can be obtained by magnifying the main surface of the GaAs single crystal substrate by 100 times with a microscope and counting the number of etch pits within a field of view of 1 mm square (meaning a square of 1 mm×1 mm; the same applies to the description below). An average value of the EPD can be obtained by counting the number of etch pits at 5 mm intervals along each of four directions equivalent to a <110> direction from the center of the main surface and averaging the resultant numbers. Furthermore, the average value of the EPD can also be obtained by counting the number of etch pits at 5 mm intervals along each of four directions equivalent to a <100> direction from the center of the main surface and averaging the resultant numbers.

3. Evaluation of Whether or Not Slip Occurs

By applying a thermal history similar to a thermal history when a semiconductor layer is grown on the above-described GaAs single crystal substrate, evaluation of whether or not slip occurs is made. Specifically, a temperature of the above-described GaAs single crystal substrate is elevated to 600° C. at a rate of 40° C./min under a $AsH_3$ (arsine) atmosphere in an OMVPE (organic metal vapor phase growth) furnace, and the temperature is kept for 10 minutes, and then, the above-described GaAs single crystal substrate is cooled at a setting of 100° C./min. Thereafter, observation of whether or not slip occurs in the GaAs single crystal substrate is made with a differential interference microscope. The results are shown in Table 1.

Example 1

1. Production of GaAs Single Crystal

Similarly to Comparative Example 1, using the manufacturing apparatus shown in FIG. 3, a semi-insulating GaAs single crystal including a straight body portion having a diameter of 156 mm and a length of 200 mm is produced in accordance with the VB method. A GaAs polycrystal is used as the GaAs source material. $B_2O_3$ is used as the sealing member. A high-purity high-alumina-fiber heat insulating member (Denka Alcen manufactured by Denka Company Limited) having a thickness of 5 mm is used as the heat retention member. A temperature distribution in the manufacturing apparatus is adjusted such that a temperature gradient in a crystal growth direction at a crystal growth interface is 2° C./cm, and the GaAs single crystal is grown. Next, the grown GaAs single crystal is cooled to a heat equalization temperature of 1100° C., and the temperature is kept for 10 hours, and then, the GaAs single crystal is cooled at 25° C./min. A temperature distribution in the heater is adjusted such that a temperature difference in the GaAs single crystal at this time measured in the similar manner as in Comparative Example 1 is 10±0.1° C. Similarly to Comparative Example 1, the GaAs single crystal including the straight body portion having a diameter of 152.4 mm is produced from the cooled GaAs single crystal.

2. Production of GaAs Single Crystal Substrate

Similarly to Comparative Example 1, two GaAs single crystal substrates each having a diameter of 152.4 mm and a thickness of 700 μm are produced from the GaAs single crystal obtained above. Similarly to Comparative Example 1, for each of the obtained GaAs single crystal substrates, a type (compressive or tensile) of a residual strain in a tangential direction in an outer circumferential portion and an average value of the magnitude of the residual strain in the outer circumferential portion are evaluated. The results are shown in Table 1.

3. Evaluation of Whether or Not Slip Occurs

Similarly to Comparative Example 1, for each of the above-described GaAs single crystal substrates, evaluation of whether or not slip occurs in the GaAs single crystal substrate is made. The results are shown in Table 1.

Example 2

1. Production of GaAs Single Crystal

Similarly to Comparative Example 1, using the manufacturing apparatus shown in FIG. 3, a semi-insulating GaAs single crystal including a straight body portion having a diameter of 156 mm and a length of 200 mm is produced in accordance with the VB method. A GaAs polycrystal is used as the GaAs source material. $B_2O_3$ is used as the sealing member. A high-purity high-alumina-fiber heat insulating member (Denka Alcen manufactured by Denka Company Limited) having a thickness of 5 mm is used as the heat retention member. A temperature distribution in the manufacturing apparatus is adjusted such that a temperature gradient in a crystal growth direction at a crystal growth interface is 2° C./cm, and the GaAs single crystal is grown. Next, the grown GaAs single crystal is cooled to a heat equalization temperature of 1100° C., and the temperature is kept for 10 hours, and then, the GaAs single crystal is cooled at 25° C./min. A temperature distribution in the heater is adjusted such that a temperature difference in the GaAs single crystal at this time measured in the similar manner as in Comparative Example 1 is 5±0.1° C. Similarly to Comparative Example 1, the GaAs single crystal including the straight body portion having a diameter of 152.4 mm is produced from the cooled GaAs single crystal.

2. Production of GaAs Single Crystal Substrate

Similarly to Comparative Example 1, two GaAs single crystal substrates each having a diameter of 152.4 mm and a thickness of 700 μm are produced from the GaAs single crystal obtained above. Similarly to Comparative Example 1, for each of the obtained GaAs single crystal substrates, a type (compressive or tensile) of a residual strain in a tangential direction in an outer circumferential portion and an average value of the magnitude of the residual strain in the outer circumferential portion are evaluated. The results are shown in Table 1.

3. Evaluation of Whether or Not Slip Occurs

Similarly to Comparative Example 1, for each of the above-described GaAs single crystal substrates, evaluation of whether or not slip occurs in the GaAs single crystal substrate is made. The results are shown in Table 1.

Example 3

1. Production of GaAs Single Crystal

Similarly to Comparative Example 1, using the manufacturing apparatus shown in FIG. 3, a semi-insulating GaAs single crystal including a straight body portion having a diameter of 156 mm and a length of 200 mm is produced in accordance with the VB method. A GaAs polycrystal is used as the GaAs source material. $B_2O_3$ is used as the sealing member. A high-purity high-alumina-fiber heat insulating member (Denka Alcen manufactured by Denka Company Limited) having a thickness of 5 mm is used as the heat retention member. A temperature distribution in the manufacturing apparatus is adjusted such that a temperature gradient in a crystal growth direction at a crystal growth interface is 2° C./cm, and the GaAs single crystal is grown. Next, the grown GaAs single crystal is cooled to a heat equalization temperature of 1100° C., and the temperature is kept for 10 hours, and then, the GaAs single crystal is cooled at 25° C./min. A temperature distribution in the heater is adjusted such that a temperature difference in the GaAs single crystal at this time measured in the similar manner as in Comparative Example 1 is 2±0.1° C. Similarly to Comparative Example 1, the GaAs single crystal including the straight body portion having a diameter of 152.4 mm is produced from the cooled GaAs single crystal.

2. Production of GaAs Single Crystal Substrate

Similarly to Comparative Example 1, two GaAs single crystal substrates each having a diameter of 152.4 mm and a thickness of 700 μm are produced from the GaAs single crystal obtained above. Similarly to Comparative Example 1, for each of the obtained GaAs single crystal substrates, a type (compressive or tensile) of a residual strain in a tangential direction in an outer circumferential portion and an average value of the magnitude of the residual strain in the outer circumferential portion are evaluated. The results are shown in Table 1.

3. Evaluation of Whether or Not Slip Occurs

Similarly to Comparative Example 1, for each of the above-described GaAs single crystal substrates, evaluation of whether or not slip occurs in the GaAs single crystal substrate is made. The results are shown in Table 1.

TABLE 1

Diameter of substrate: 152.4 mm

| | Comparative Example 1 | | Example 1 | | Example 2 | | Example 3 | |
|---|---|---|---|---|---|---|---|---|
| Temperature difference (° C.) | 20 ± 0.2 | | 10 ± 0.1 | | 5 ± 0.1 | | 2 ± 0.1 | |
| Position of substrate in crystal | seed crystal side | finally solidified portion side | seed crystal side | finally solidified portion side | seed crystal side | finally solidified portion side | seed crystal side | finally solidified portion side |
| Type of residual strain in tangential direction | tensile | tensile | compressive | compressive | compressive | compressive | compressive | compressive |
| Average value of magnitude of residual strain | $1.3 \times 10^{-5}$ | $1.1 \times 10^{-5}$ | $7.5 \times 10^{-6}$ | $1.0 \times 10^{-5}$ | $5.6 \times 10^{-6}$ | $1.1 \times 10^{-5}$ | $3.5 \times 10^{-6}$ | $1.2 \times 10^{-5}$ |
| Average EPD ($cm^{-2}$) | $6.0 \times 10^3$ | $6.1 \times 10^3$ | $5.9 \times 10^3$ | $6.0 \times 10^3$ | $6.1 \times 10^3$ | $6.0 \times 10^3$ | $6.0 \times 10^3$ | $5.9 \times 10^3$ |
| Occurrence of slip | occur | occur | not occur | not occur | not occur | not occur | not occur | not occur |

Comparative Example 2

1. Production of GaAs Single Crystal

Using the manufacturing apparatus shown in FIG. 2, a C (carbon)-doped semi-insulating GaAs single crystal including a straight body portion having a diameter of 208 mm and a length of 100 mm is produced in accordance with the VB method. A GaAs polycrystal is used as the GaAs source material. $B_2O_3$ is used as the sealing member. A temperature distribution in the manufacturing apparatus is adjusted such that a temperature gradient in a crystal growth direction at a crystal growth interface is 2° C./cm, and the GaAs single crystal is grown. Next, the grown GaAs single crystal is cooled to the room temperature (25° C.) at 25° C./min. A temperature difference in the GaAs single crystal at this time is 20±0.2° C. in the entire straight body portion of the GaAs single crystal. An outer circumferential surface of the cooled GaAs single crystal is ground, to thereby produce the GaAs single crystal including the straight body portion having a diameter of 203.2 mm.

2. Production of GaAs Single Crystal Substrate

The GaAs single crystal obtained above is sliced along a plane of the straight body portion perpendicular to a central axis, and front and rear main surfaces are both mirror-finished by mechanical polishing and chemical mechanical polishing (CMP), to thereby produce two (one from the seed crystal side and one from the finally solidified portion side) GaAs single crystal substrates each having a diameter of 203.2 mm and a thickness of 700 μm. There is no affected layer on both of the polished front and rear main surfaces. Various types of cleaning that can maintain the mirror surfaces after polishing may be performed. For each of the GaAs single crystal substrates obtained as described above, a type (compressive or tensile) of a residual strain in a tangential direction in an outer circumferential portion is evaluated from a Raman shift by measuring a Raman spectrum using a Raman spectrophotometer (HR evolution manufactured by HORIBA, Ltd.). Determination of an orientation of the residual strain in the tangential direction does not specify the magnitude, and thus, a measurement method other than the Raman shift may be used as long as it can determine the orientation. Evaluation of an average value of the magnitude of the residual strain in the outer circumferential portion represented by an absolute value |Sr−St| of a difference between a radial strain component Sr and a tangential strain component St can be performed based on, for example, the photoelastic method described in Appl. Phys. Lett. 47 (1985) pp. 365-367. Specifically, a light irradiation diameter on each substrate main surface is ϕ100 μm. The above-described average value of the magnitude of the residual strain in the outer circumferential portion is calculated by scanning and measuring the entire main surface at 0.5 mm-pitch square lattice points such that the center of the substrate main surface is included in the measurement points, and averaging all of the measurement values included in the outer circumferential portion extending between an inner circumference located 10 mm inward from an outer circumference toward a center and a location located 5 mm inward from the outer circumference. The crystallinity is evaluated by an average EPD (etch pit density) in the entire location located 5 mm inward from the outer circumferential surface. Specifically, molten potassium hydroxide is used as an etchant. The EPD can be obtained by magnifying the main surface of the GaAs single crystal substrate by 100 times with a microscope and counting the number of etch pits within a field of view of 1 mm square. An average value of the EPD can be obtained by counting the number of etch pits at 5 mm intervals along each of four directions equivalent to a <110> direction from the center of the main surface and averaging the resultant numbers. Furthermore, the average value of the EPD can also be obtained by counting the number of etch pits at 5 mm intervals along each of four directions equivalent to a <100> direction from the center of the main surface and averaging the resultant numbers.

3. Evaluation of Whether or Not Slip Occurs

By applying a thermal history similar to a thermal history when a semiconductor layer is grown on the above-described GaAs single crystal substrate, evaluation of whether or not slip occurs is made. Specifically, a temperature of the above-described GaAs single crystal substrate is elevated to 600° C. at a rate of 40° C./min under a $AsH_3$ (arsine) atmosphere in an OMVPE (organic metal vapor phase growth) furnace, and the temperature is kept for 10 minutes, and then, the above-described GaAs single crystal substrate is cooled at a setting of 100° C./min. Thereafter, observation of whether or not slip occurs in the GaAs single crystal substrate is made with a differential interference microscope. The results are shown in Table 2.

Comparative Example 3

1. Production of GaAs Single Crystal

Similarly to Comparative Example 2, using the manufacturing apparatus shown in FIG. 3, a semi-insulating GaAs single crystal including a straight body portion having a diameter of 208 mm and a length of 100 mm is produced in accordance with the VB method. A GaAs polycrystal is used as the GaAs source material. $B_2O_3$ is used as the sealing member. A high-purity high-alumina-fiber heat insulating member (Denka Alcen manufactured by Denka Company Limited) having a thickness of 5 mm is used as the heat retention member. A temperature distribution in the manufacturing apparatus is adjusted such that a temperature gradient in a crystal growth direction at a crystal growth interface is 2° C./cm, and the GaAs single crystal is grown. Next, the grown GaAs single crystal is cooled to a heat equalization temperature of 1100° C., and the temperature is kept for 10 hours, and then, the GaAs single crystal is cooled at 25° C./min. A temperature distribution in the heater is adjusted such that a temperature difference in the GaAs single crystal at this time measured in the similar manner as in Comparative Example 2 is 10±0.1° C. Similarly to Comparative Example 2, the GaAs single crystal including the straight body portion having a diameter of 203.2 mm is produced from the cooled GaAs single crystal.

2. Production of GaAs Single Crystal Substrate

Similarly to Comparative Example 2, two GaAs single crystal substrates each having a diameter of 203.2 mm and a thickness of 700 μm are produced from the GaAs single crystal obtained above. Similarly to Comparative Example 2, for each of the obtained GaAs single crystal substrates, a type (compressive or tensile) of a residual strain in a tangential direction in an outer circumferential portion and an average value of the magnitude of the residual strain in the outer circumferential portion are evaluated. The results are shown in Table 2.

3. Evaluation of Whether or Not Slip Occurs

Similarly to Comparative Example 2, for each of the above-described GaAs single crystal substrates, evaluation of whether or not slip occurs in the GaAs single crystal substrate is made. The results are shown in Table 2.

Example 4

1. Production of GaAs Single Crystal

Similarly to Comparative Example 2, using the manufacturing apparatus shown in FIG. 3, a semi-insulating GaAs single crystal including a straight body portion having a diameter of 208 mm and a length of 100 mm is produced in accordance with the VB method. A GaAs polycrystal is used as the GaAs source material. $B_2O_3$ is used as the sealing member. A high-purity high-alumina-fiber heat insulating member (Denka Alcen manufactured by Denka Company Limited) having a thickness of 5 mm is used as the heat retention member. A temperature distribution in the manufacturing apparatus is adjusted such that a temperature gradient in a crystal growth direction at a crystal growth interface is 2° C./cm, and the GaAs single crystal is grown. Next, the grown GaAs single crystal is cooled to a heat equalization temperature of 1100° C., and the temperature is kept for 10 hours, and then, the GaAs single crystal is cooled at 25° C./min. A temperature distribution in the heater is adjusted such that a temperature difference in the GaAs single crystal at this time measured in the similar manner as in Comparative Example 2 is 5±0.1° C. Similarly to Comparative Example 2, the GaAs single crystal including the straight body portion having a diameter of 203.2 mm is produced from the cooled GaAs single crystal.

2. Production of GaAs Single Crystal Substrate

Similarly to Comparative Example 2, two GaAs single crystal substrates each having a diameter of 203.2 mm and a thickness of 700 μm are produced from the GaAs single crystal obtained above. Similarly to Comparative Example 2, for each of the obtained GaAs single crystal substrates, a type (compressive or tensile) of a residual strain in a tangential direction in an outer circumferential portion and an average value of the magnitude of the residual strain in the outer circumferential portion are evaluated. The results are shown in Table 2.

3. Evaluation of Whether or Not Slip Occurs

Similarly to Comparative Example 2, for each of the above-described GaAs single crystal substrates, evaluation of whether or not slip occurs in the GaAs single crystal substrate is made. The results are shown in Table 2.

Example 5

1. Production of GaAs Single Crystal

Similarly to Comparative Example 2, using the manufacturing apparatus shown in FIG. 3, a semi-insulating GaAs single crystal including a straight body portion having a diameter of 208 mm and a length of 100 mm is produced in accordance with the VB method. A GaAs polycrystal is used as the GaAs source material. $B_2O_3$ is used as the sealing member. A high-purity high-alumina-fiber heat insulating member (Denka Alcen manufactured by Denka Company Limited) having a thickness of 5 mm is used as the heat retention member. A temperature distribution in the manufacturing apparatus is adjusted such that a temperature gradient in a crystal growth direction at a crystal growth interface is 2° C./cm, and the GaAs single crystal is grown. Next, the grown GaAs single crystal is cooled to a heat equalization temperature of 1100° C., and the temperature is kept for 10 hours, and then, the GaAs single crystal is cooled at 25° C./min. A temperature distribution in the heater is adjusted such that a temperature difference in the GaAs single crystal at this time measured in the similar manner as in Comparative Example 2 is 2±0.1° C. Similarly to Comparative Example 2, the GaAs single crystal including the straight body portion having a diameter of 203.2 mm is produced from the cooled GaAs single crystal.

2. Production of GaAs Single Crystal Substrate

Similarly to Comparative Example 2, two GaAs single crystal substrates each having a diameter of 203.2 mm and a thickness of 700 μm are produced from the GaAs single crystal obtained above. Similarly to Comparative Example 2, for each of the obtained GaAs single crystal substrates, a type (compressive or tensile) of a residual strain in a tangential direction in an outer circumferential portion and an average value of the magnitude of the residual strain in the outer circumferential portion are evaluated. The results are shown in Table 2.

3. Evaluation of Whether or Not Slip Occurs

Similarly to Comparative Example 2, for each of the above-described GaAs single crystal substrates, evaluation of whether or not slip occurs in the GaAs single crystal substrate is made. The results are shown in Table 2.

TABLE 2

| | Comparative Example 2 | | Comparative Example 3 | | Example 4 | | Example 5 | |
|---|---|---|---|---|---|---|---|---|
| | Diameter of substrate: 203.2 mm | | | | | | | |
| Temperature difference (° C.) | 20 ± 0.2 | | 10 ± 0.1 | | 5 ± 0.1 | | 2 ± 0.1 | |
| Position of substrate in crystal | seed crystal side | finally solidified portion side | seed crystal side | finally solidified portion side | seed crystal side | finally solidified portion side | seed crystal side | finally solidified portion side |
| Type of residual strain in tangential direction | tensile | tensile | tensile | tensile | compressive | compressive | compressive | compressive |
| Average value of magnitude of residual strain | $2.0 \times 10^{-5}$ | $1.5 \times 10^{-5}$ | $8.5 \times 10^{-6}$ | $1.1 \times 10^{-5}$ | $7.0 \times 10^{-6}$ | $1.2 \times 10^{-5}$ | $5.5 \times 10^{-6}$ | $1.4 \times 10^{-5}$ |
| Average EPD (cm$^{-2}$) | $8.1 \times 10^{3}$ | $8.0 \times 10^{3}$ | $8.0 \times 10^{3}$ | $8.1 \times 10^{3}$ | $8.1 \times 10^{3}$ | $7.9 \times 10^{3}$ | $8.0 \times 10^{3}$ | $8.1 \times 10^{3}$ |
| Occurrence of slip | occur | occur | occur | occur | not occur | not occur | not occur | not occur |

Referring to Tables 1 and 2, by reducing the temperature difference in the GaAs single crystal in the cooling step, the GaAs single crystal and the GaAs single crystal substrate in which the residual strain in the tangential direction in the outer circumferential portion is a compressive strain are obtained, and slip does not occur in the GaAs single crystal substrate when the semiconductor layer is grown on the GaAs single crystal substrate.

It should be understood that the embodiments and examples disclosed herein are illustrative and non-restrictive in every respect. The scope of the present invention is defined by the terms of the claims, rather than the embodiments and examples above, and is intended to include any modifications within the scope and meaning equivalent to the terms of the claims.

REFERENCE SIGNS LIST

1 GaAs single crystal substrate; 1c, 10c inner circumferential portion; 1d, 10d outer circumferential portion; 1e outer circumference; 1i inner circumference; 1o center; 10 GaAs single crystal; 10e outer circumferential surface; 10i inner circumferential surface; 10o central axis; 11 GaAs seed crystal; 13 GaAs source material; 20 manufacturing apparatus; 21 container; 210 container main body; 21p container lid; 22 crucible; 23 sealing member; 24 heat retention member; 25 holding table; 26 heater.

The invention claimed is:

1. A gallium arsenide single crystal comprising a straight body portion having a cylindrical shape, wherein
a residual strain in a tangential direction in an outer circumferential portion is a compressive strain, the outer circumferential portion extending between an inner circumferential surface located 10 mm inward from an outer circumferential surface of the straight body portion toward a central axis and a location located 5 mm inward from the outer circumferential surface.

2. The gallium arsenide single crystal according to claim 1, wherein
an average value of the magnitude of the residual strain in the outer circumferential portion is not less than 2.5× 10$^{-6}$ and not more than 1.5×10$^{-5}$, the magnitude of the residual strain being represented by an absolute value |Sr-St| of a difference between a radial strain component Sr and a tangential strain component St.

3. The gallium arsenide single crystal according to claim 1, wherein
the straight body portion has a diameter of not less than 100 mm and not more than 305 mm.

4. The gallium arsenide single crystal according to claim 1, wherein
an average value of the magnitude of the residual strain in the outer circumferential portion is not less than 2.5× 10$^{-6}$ and not more than 1.5×10$^{-5}$, the magnitude of the residual strain being represented by an absolute value |Sr-St| of a difference between a radial strain component Sr and a tangential strain component St, and
the straight body portion has a diameter of not less than 100 mm and not more than 305 mm.

5. A gallium arsenide single crystal substrate, wherein
a residual strain in a tangential direction in an outer circumferential portion is a compressive strain, the outer circumferential portion extending between an inner circumference located 10 mm inward from an outer circumference toward a center and a location located 5 mm inward from the outer circumference.

6. The gallium arsenide single crystal substrate according to claim 5, wherein
an average value of the magnitude of the residual strain in the outer circumferential portion is not less than 2.5× 10$^{-6}$ and not more than 1.5×10$^{-5}$, the magnitude of the residual strain being represented by an absolute value |Sr-St| of a difference between a radial strain component Sr and a tangential strain component St.

7. The gallium arsenide single crystal substrate according to claim 5, wherein
a diameter is not less than 100 mm and not more than 305 mm.

8. The gallium arsenide single crystal substrate according to claim 5, wherein
an average value of the magnitude of the residual strain in the outer circumferential portion is not less than 2.5× 10$^{-6}$ and not more than 1.5×10$^{-5}$, the magnitude of the residual strain being represented by an absolute value |Sr-St| of a difference between a radial strain component Sr and a tangential strain component St, and
a diameter is not less than 100 mm and not more than 305 mm.

9. The gallium arsenide single crystal substrate according to claim 5, wherein a diameter is not less than 150 mm and not more than 305 mm.

* * * * *